United States Patent [19]
Yasukawa et al.

[11] Patent Number: 5,793,106
[45] Date of Patent: Aug. 11, 1998

[54] SEMICONDUCTOR DEVICE

[75] Inventors: Akio Yasukawa, Kashiwa; Hirohisa Yamamura, Hitachioota; Shotaro Naito, Hitachinaka; Heikichi Kuwahara, Tsuchiura; Osamu Suzuki, Ibaraki-ken; Masanori Muso, Hitachinaka; Nobuo Fujieda, Ibaraki-ken, all of Japan

[73] Assignee: Hitachi, Ltd., Tokyo, Japan

[21] Appl. No.: 608,565

[22] Filed: Feb. 28, 1996

[30] Foreign Application Priority Data

Feb. 28, 1995 [JP] Japan ................. 7-040090

[51] Int. Cl.$^6$ ............ H01L 23/34; H01L 23/10; H01L 23/28; H01L 23/29
[52] U.S. Cl. ............ 257/712; 257/713; 257/717; 257/719; 257/723; 257/706; 257/787; 257/793; 257/796
[58] Field of Search ............ 257/712, 706, 257/675, 723, 718, 719, 720, 783, 785, 787, 788, 795, 796, 713, 717; 361/702, 704, 709, 711; 148/559, 580

[56] References Cited

U.S. PATENT DOCUMENTS 5,258,649  11/1993  Tanaka et al. ............ 257/796

FOREIGN PATENT DOCUMENTS 61-218151   9/1986   Japan .
1-286348   11/1989   Japan ................. 257/720
1-319971   12/1989   Japan ................. 257/706
5-25392     4/1993   Japan .
6-21289     1/1994   Japan .

OTHER PUBLICATIONS

Webster's II New Riverside University Dictionary.

Primary Examiner—Mahshid D. Saadat
Assistant Examiner—Jhihan B. Clark
Attorney, Agent, or Firm—Antonelli, Terry, Stout & Kraus, LLP

[57] ABSTRACT

A semiconductor device, suitable for use in an invertor device for large currents in which IGBT chips are used and of which a high reliability is required, has an insulating plate on which are mounted semiconductor chips, a resin case enclosing the semiconductor chips, a filler resin filled into the resin case and covering the semiconductor chips and filling in the space between the semiconductor chips and the resin case, and a heatsink to which the insulating plate is attached, wherein, for purposes of attaching the insulating plate to the heatsink, the resin case is used to press the insulating plate onto the heatsink. Some benefits of this construction are that is makes it possible to eliminate the problem of fatigue failure of a solder layer previously used for attaching the insulating plate to the heatsink by dispensing with that solder layer, while at the same time improving the transfer of heat from the insulating plate to the heatsink, and thereby improving the removal of heat from the device. The construction also makes it possible to reduce cracking of the insulating plate, reduce breakage of mounting portions of the resin case and to use the device to make a small, thin, light and highly reliable invertor device.

15 Claims, 5 Drawing Sheets

SEMICONDUCTOR DEVICE

BACKGROUND OF THE INVENTION

This invention relates to a semiconductor device having a highly reliable structure, and particularly to a semiconductor device having a structure which is suitable for use in an invertor device for large currents in which IGBT chips are used and of which a high reliability is required.

Among conventional semiconductor devices, there have been those having a structure as disclosed, for example, in Japanese Unexamined Utility Model Publication No. S.61-218151. This kind of conventional semiconductor device has a structure consisting mainly of an insulating plate on which is mounted a semiconductor chip, a resin case enclosing the semiconductor chip, a filler resin filled into the resin case and covering the semiconductor chip and filling in the space between the semiconductor chip and the resin case, and a heatsink attached to the insulating plate.

However, in the conventional semiconductor device described above, not enough consideration has been given to the need for absorption of a differential thermal expansion between the metallic heatsink constituting the base of the device and the insulating plate, and so there has been the problem that fatigue failure has tended to occur in a solder layer which bonds the heatsink to the insulating plate due to repeated thermal stress occurring between the heatsink and the insulating plate.

Also, in this conventional semiconductor device, when the solder layer is made thick in order to prevent fatigue failure of the solder, there has been the problem that the thermal resistance of this solder layer becomes large and it becomes difficult for heat produced by the semiconductor chip to escape to the heatsink.

Furthermore, in this conventional semiconductor device, not enough consideration has been given to stresses arising in the insulating plate due, for example, to differential thermal expansion between the heatsink and the insulating plate, and so cracking of the insulating plate has sometimes occurred.

Moreover, in this conventional semiconductor device, not enough consideration has been given to thermal stresses arising in mounting portions of the resin case, and so failure of the mounting portions has sometimes occurred.

Also, when this conventional semiconductor device is used to make an invertor device, there has been the problem that the invertor device is large, thick and heavy.

SUMMARY OF THE INVENTION

Accordingly, a first object of this invention is to provide a semiconductor device in which it is possible to reduce fatigue failure of a solder layer in the semiconductor device.

A second object of the invention is to provide a semiconductor device in which it is possible to improve the removal of heat produced in the semiconductor device.

A third object of the invention is to provide a semiconductor device in which it is possible to reduce cracking of an insulating plate in the semiconductor device.

A fourth object of the invention is to provide a semiconductor device in which it is possible to reduce breakage of mounting portions of a resin case in the semiconductor device.

A fifth object of the invention is to provide a semiconductor device with which it is possible to make a small, thin and light weight invertor device.

To achieve the above-mentioned objects and other objects, the invention provides a semiconductor device having an insulating plate on which is mounted a semiconductor chip, a resin case enclosing the semiconductor chip, a filler resin filled into the resin case and covering the semiconductor chip and filling in the space between the semiconductor chip and the resin case, and a heatsink to which the insulating plate is attached, characterized in that, for purposes of attaching the insulating plate to the heatsink the resin case is used to press the insulating plate onto the heatsink.

In a semiconductor device according to the invention, preferably, a metal film is formed on the face of the insulating plate on the heatsink side thereof and the resin case has a projection positioned inside of said metal film outline, which projection presses the insulating plate toward the heat sink from the face of the insulating plate opposite the heatsink side thereof.

Also, in a semiconductor device according to the invention, preferably, the projection is provided in the form of a ring positioned on lines substantially parallel with the edges formed by the faces of the insulating plate, and the semiconductor chip is disposed inside the ring-form boundary of the projection.

Also, in a semiconductor device according to the invention, preferably, bolt holes for bolts to pass through are provided in the resin case, screw holes for the bolts are provided in the heatsink and the insulating plate is pressed against the heatsink by head portions of the bolts which pass through the resin case and are screwed into the screw holes formed in the heatsink.

Also, in a semiconductor device according to the invention, preferably, inside the ring-form projection on the resin case there is provided a pressing member for pressing the insulating plate, this pressing member being formed integrally with the resin case ,and the insulating plate is pressed against the heatsink by the pressing member and the ring-form projection.

Also, in a semiconductor device according to the invention, preferably, a grease layer is provided between the insulating plate and the heatsink.

The invention also provides a semiconductor device having an insulating plate on which is mounted a semiconductor chip, a resin case enclosing the semiconductor chip, a filler resin filled into the resin case and covering the semiconductor chip and filling in the space between the semiconductor chip and the resin case, and a heatsink to which the insulating plate is attached, characterized in that the insulating plate and the heatsink are thermally joined by the resin case applying a contact pressure to the insulating plate.

The invention also provides an invertor device having an insulating plate on which is mounted a semiconductor chip, a resin case enclosing the semiconductor chip, a filler resin filled into the resin case and covering the semiconductor chip and filling in the space between the semiconductor chip and the resin case, and a heatsink to which the insulating plate is attached, characterized in that an insulating plate and a resin case are provided for each circuit supplying an output of a phase of the invertor device, and the insulating plates are pressed against the heatsink by the resin cases being fixed to the heatsink by bolts.

The invention also provides an invertor device having an insulating plate on which is mounted a semiconductor chip, a resin case enclosing the semiconductor chip, a filler resin filled into the resin case and covering the semiconductor chip and filling in the space between the semiconductor chip and the resin case, and a heatsink to which the insulating plate is attached, characterized in that the resin case has terminal plates which project from the resin case in directions substantially parallel to the surface of the heatsink, wherein a terminal plate for a gate driving circuit and a terminal plate for a power supply circuit project from one side of the resin case and a terminal plate for an output projects from the opposite side of the resin case.

Also, the invention provides an invertor device having an insulating plate on which is mounted a semiconductor chip, a resin case enclosing the semiconductor chip, a filler resin filled into the resin case and covering the semiconductor chip and filling in the space between the semiconductor chip and the resin case, and a heatsink to which the insulating plate is attached, characterized in that two terminal plates for a power supply circuit of the semiconductor chip are both flat plates and these two flat plates are mutually superposed with an insulator interposed therebetween and are directly connected and fixed to capacitor terminals outside the resin case.

Because a semiconductor device according to the invention has a structure wherein, for purposes of pressing the insulating plate against the heatsink, the resin case is used to press the insulating plate against the heatsink, a solder layer between the insulating plate and the heatsink becomes unnecessary; also, because any differential thermal expansion between the insulating plate and the heatsink is absorbed as slippage between the insulating plate and the heatsink, thermal fatigue failure of the joined parts of the insulating plate and the heatsink does not occur. Furthermore, because the insulating plate and the heatsink are pressed into contact with each other, heat flows easily between the insulating plate and the heatsink and good removal of heat from the semiconductor device is ensured.

Also, in a semiconductor device according to the invention, by forming a metal film on the face of the insulating plate on the heatsink side thereof and by providing the resin case with a projection positioned on lines substantially parallel with the edges formed by the faces of the insulating plate, which presses the insulating plate toward the heatsink from the face of the insulating plate opposite the heatsink side thereof, the forces pressing the insulating plate are applied by way of the resin of the resin case and stresses occurring in the insulating plate are moderated, and consequently cracking of the insulating plate is prevented.

Here, the projection provided on the resin case presses on parts of the insulating plate located inside the periphery of the metal film formed on the face of the insulating plate on the heatsink side thereof, that is, formed on the rear face of the insulating plate, and thereby the insulating plate is pushed toward the heatsink on the rear face side of the insulating plate from the front face side of the insulating plate. As a result, even if the heatsink is curved, the insulating plate can be pressed into contact with the heatsink, movement of heat from the insulating plate to the heatsink is made easy and the removal of heat from the semiconductor device is improved.

Also, in a semiconductor device according to the invention, due to the projection provided on the resin case being formed in the form of a ring positioned on lines substantially parallel with the edges formed by the faces of the insulating plate and the semiconductor chip being disposed inside the ring-form projection, it is possible to prevent leakage of the filler resin to the outside of the resin case. As a result, because the semiconductor chip can be certainly covered with a small amount of filler resin, while still ensuring insulation of the vicinity of the surface of the semiconductor chip, the quantity of filler resin used can be reduced and the semiconductor device thereby can be made light. Also, the contact quality between the part of the insulating plate on which the semiconductor chip is mounted and the heatsink can be increased, and removal of heat from this part of the insulating plate can therefore be improved.

Also, in a semiconductor device according to the invention, by providing bolt holes in the resin case for bolts to pass through and screw holes for the bolts in the heatsink, so that the insulating plate may be pressed against the heatsink using the bolts which pass through the resin case and are screwed into the screw holes formed in the heatsink, an optimal pressing force can be realized and good heat removal characteristics and prevention of cracking of the insulating plate can both be achieved at the same time.

Also, in a semiconductor device according to the invention, by providing a pressing member for pressing the insulating plate inside the ring-form projection of the resin case and forming this pressing member integrally with the resin case, so that the insulating plate is pressed against the heatsink by the pressing member and the ring-form projection, an even more optimal pressing force can be realized and good heat removal characteristics and prevention of cracking of the insulating plate can both be achieved at the same time.

Also, in a semiconductor device according to the invention, by providing a grease layer between the insulating plate and the heatsink, minute gaps between the insulating plate and the heatsink are filled in by the grease and as a result the radiation of heat from the semiconductor device is further improved.

Also, in a semiconductor device according to the invention, since the insulating plate and the heatsink are thermally joined by the resin case applying a contact pressure to the insulating plate, any differential thermal expansion between the insulating plate and the heatsink is absorbed as slippage between the contacting parts of the two plates, and as a result failure of mounting portions of the resin case is prevented.

Also, in an invertor device according to the invention, because a structure is adopted wherein an insulating plate and a resin case are provided for each circuit supplying an output of a phase of the invertor device and the insulating plates are pressed against the heatsink by the resin cases being fixed to the heatsink by bolts, the contact between the insulating plates and the heatsink can be made good and the removal of heat from the invertor device can be improved. Also, because separate resin cases are provided, the total amount of filler resin put into the resin cases in the invertor device is reduced and the invertor device can be made small and light.

Also, in an invertor device according to the invention, by providing the resin case with terminal plates which project from the resin from the resin case in directions substantially parallel to the surface of the heatsink and two terminal plates for a power supply circuit which project from one side of the resin case and a terminal plate for an output which projects from the opposite side of the resin case, the arrangement of the wiring to the outside of the resin case becomes easy and the invertor device can be made thin and small.

Also, in an invertor device according to the invention having an insulating plate on which is mounted a semiconductor chip, a resin case enclosing the semiconductor chip, a filler resin filled into the resin case and covering the semiconductor chip and filling in the space between the semiconductor chip and the resin case, and a heatsink to which the insulating plate is attached, because two terminal plates for a power supply circuit of the semiconductor chip are both flat plates and these two flat plates are mutually superposed with an insulator interposed therebetween and directly connected and fixed to capacitor terminals outside the resin case, an invertor device which can be handled and assembled efficiently and has good manufacturability can be provided.

As described above, according to the invention, because a structure is employed wherein a resin case is used to press an insulating plate against a heatsink, it becomes unnecessary to provide a solder layer between the insulating plate and the heatsink, and a semiconductor device with no fatigue failure of a solder layer therein can be provided.

Also, according to the invention, because the insulating plate and the heatsink are pressed into contact with each other, making it easy for heat to flow between the two, a semiconductor device with improved removal of heat produced therein can be provided.

Also, according to the invention, by applying forces pressing on the insulating plate by way of the resin case, stresses occurring in the insulating plate are moderated, and it is possible to provide a semiconductor device with which cracking of the insulating plate can be reduced.

Also, according to the invention, because differential thermal expansion between the resin case and the insulating plate is absorbed as a result of the resin case and the insulating plate being joined by a contact pressure being applied between the two, it is possible to provide a semiconductor device with which failure of mounting portions of the resin case can be reduced.

Also, according to the invention, by providing an insulating plate and a resin case for each circuit supplying an output of a phase of an invertor device and by pressing the insulating plates against the heatsink by fixing the resin cases to the heatsink by bolts, the contact between the insulating plates and the heatsink can be made good and the removal of heat from the invertor device can be improved. As a result, the total amount of filler resin put into the resin cases in the invertor device can be reduced, and therefore a semiconductor device with which it is possible to make a small and lightweight invertor device can be provided.

Also, according to the invention, because two terminal plates of a power supply circuit of the semiconductor chip are both flat plates and these two flat plates are mutually superposed with an insulator interposed therebetween and directly connected and fixed to capacitor terminals outside the resin case, an invertor device which can be handled and assembled efficiently and which has good manufacturability can be provided.

DETAILED DESCRIPTION OF THE PREFERRED EMBODIMENTS

Preferred embodiments of the invention will now be described with reference to the accompanying drawings.

Figure 1:
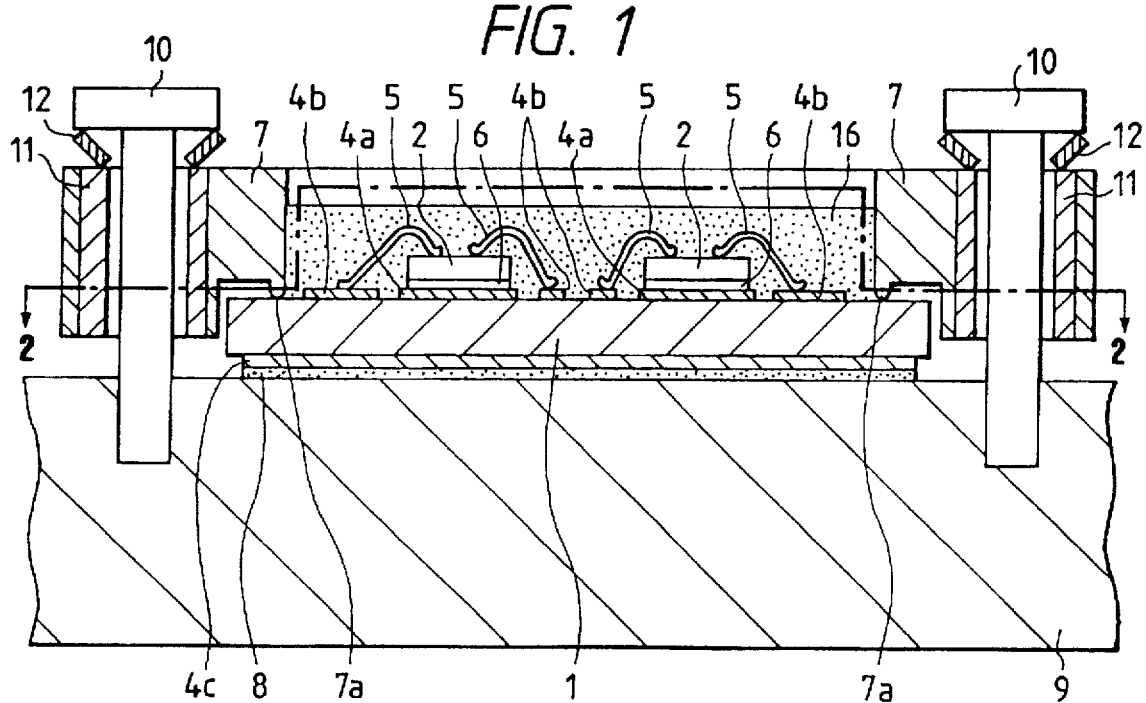
FIG. 1 is a sectional side view of main parts of a semiconductor device of a preferred embodiment of the invention.
Figure 2:
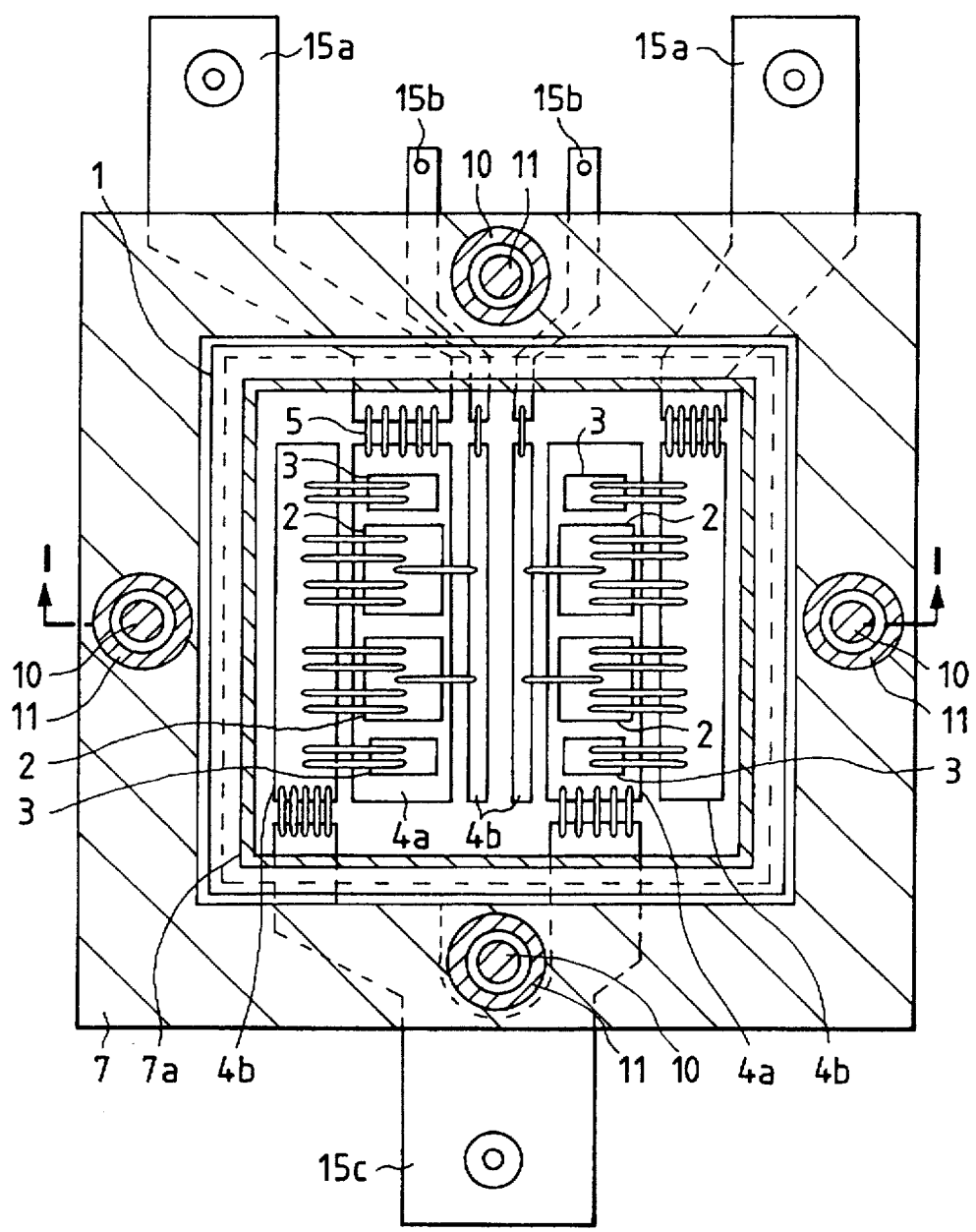
FIG. 2 is a sectional plane view of the semiconductor device on the line A—A in FIG. 1.

FIG. 1 is a sectional side view of main parts of a semiconductor device of a preferred embodiment of the invention taken of line B—B in FIG. 2, and FIG. 2 is a sectional plan view on the line A—A in FIG. 1.

This semiconductor device comprises an insulating plate 1 on which is mounted IGBT chips 2, a resin case 7 enclosing the IGBT chips 2, a filler resin 16 filled into the resin case 7 and which covers the IGBT chips 2 and fills in the space between the IGBT chips 2 and the resin case 7, and a heatsink 9 to which the insulating plate 1 is attached.

This semiconductor device is characterized in that it has a structure wherein, as means for attaching the insulating plate 1 to the heatsink 9, the resin case 7 is used to press the insulating plate 1 against the heatsink 9.

Next, the structure of this semiconductor device will be explained in detail. As shown in FIG. 1 and FIG. 2, the semiconductor device comprises as semiconductor chips four IGBT chips 2 and four diode chips 3 mounted on one insulating plate 1.

These semiconductor chips 2 and 3 can be electrically connected to form a circuit for outputting a U-phase of a high-current invertor device. Circuits for a V-phase and a W-phase can be made using similar constructions.

Figure 3:
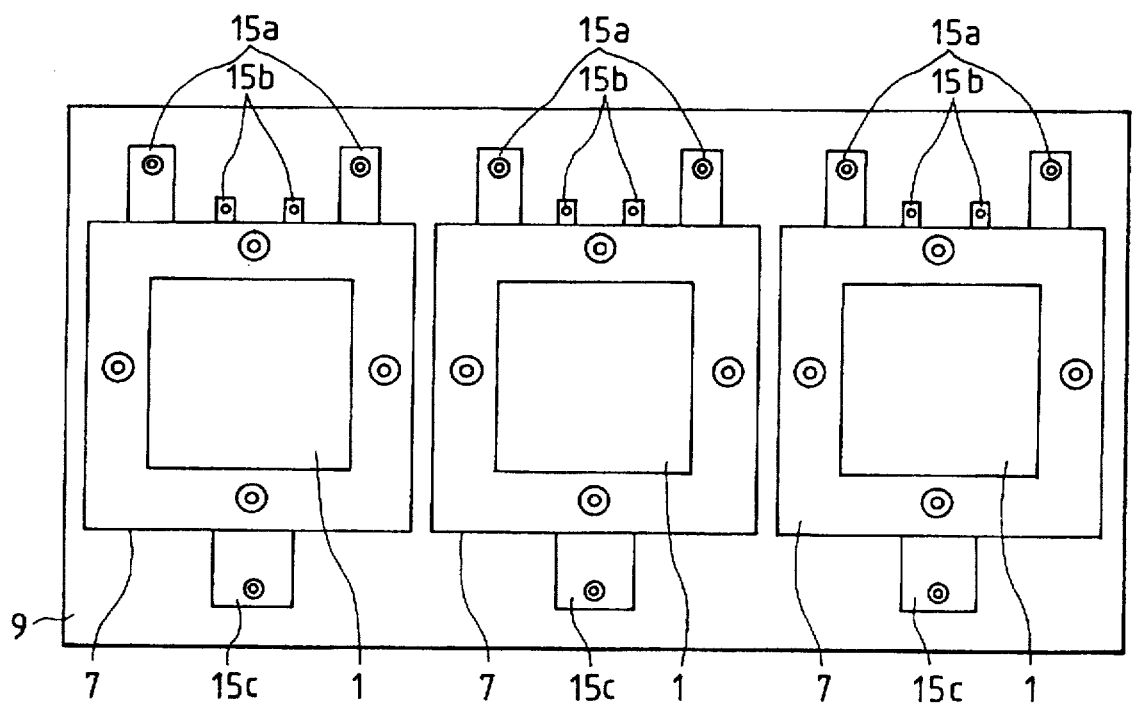
FIG. 3 is a plane view of a three-phase device using semiconductor devices of the invention.

FIG. 3 shows a 3-phase invertor device consisting mainly of three semiconductor devices like that shown in FIG. 1 and FIG. 2 disposed in a line.

As shown in FIG. 1, metal films 4a and 4b are formed on parts of the opposite face, i.e. the face not on the heatsink side, of each of the insulating plates 1, and the IGBT chips 2 and the diode chips 3 are joined to the metal films 4a with solder 6. (In FIG. 1 the diode chips 3 cannot be seen because they are hidden by the IGBT chips 2.)

Here, it is effective if aluminum nitride is used as the material of the insulating plate 1, because the difference in coefficient of thermal expansion between the insulating plate 1 and the semiconductor chips 2 and 3 is then small and distortion of the solder layers 6 between the semiconductor chips 2 and 3 and the insulating plate 1 is reduced and the life of the solder layers 6 increases.

Electrodes on the semiconductor chips 2 and 3 are connected by wires 5 to the metal films 4b. If aluminum is used for the wires 5 and copper is used for the metal films 4, the electrical resistance of these parts will be low and power losses are reduced.

A metal film 4c is formed on the rear face of the insulating plate 1. This metal film 4c covers substantially the entire surface of the rear face of the insulating plate 1. In this way the insulating plate 1, which scratches easily, is protected. The metal film 4c also serves to prevent bending of the insulating plate 1 caused by differential thermal expansion between the insulating plate 1 and the metal films 4a, 4b formed on the front face of the insulating plate 1.

The metal film 4c formed on the rear face of the insulating plate 1 does not extend to the edges of the rear face of the insulating plate 1. That is, the metal film 4c does not cover the entire rear face of the insulating plate 1.

In this way, the distance between the metal film 4c and the metal films 4a and 4b, that is, the creeping distance between the metal film 4c and the front face of the insulating plate 1, is made longer and the electrical insulation therebetween is thereby improved.

When a metal plate thicker than the insulating plate 1 is joined to the rear face of the insulating plate 1, thermal expansion of this metal plate causes distortion of the solder layers 6 under the semiconductor chips 2 and 3 and reduces the life of the solder layers 6.

In this semiconductor device, because only the metal film 4c, which is thinner than the insulating plate 1, is formed on the rear face of the insulating plate 1, thermal expansion is absorbed as deformation of the metal film 4c itself and does not cause distortion of the solder layers 6, which tends to reduce the life of the solder layers 6.

A recess for receiving the insulating plate 1 is formed in the resin case 7. Holes for bolts 10 to pass through are also formed in the resin case 7. By setting the insulating plate 1 in the recess in the resin case 7, applying grease 8 to the metal film 4c on the rear face of the insulating plate 1 and fixing the resin case 7 to the heatsink 9 with the bolts 10, the insulating plate 1 is positioned on the heatsink 9 and fixed thereto.

Here, a thinly spread layer of the grease 8 is formed between the insulating plate 1 and the heatsink 9. Because gaps formed by minute irregularities in the surface of the heatsink 9 are filled in by this layer of the grease 8, transfer of heat from the insulating plate 1 to the heatsink 9 is improved.

When the insulating plate 1 and the heatsink 9 are joined with solder as in a conventional semiconductor device of this kind, the solder layer is subjected to differential thermal expansion between the insulating plate 1 and the heatsink 9 and the life of this solder layer is reduced by thermal fatigue.

However, in the semiconductor device of this preferred embodiment, because there is no solder layer between the insulating plate 1 and the heatsink 9, and instead there is the grease layer 8, differential thermal expansion between the insulating plate 1 and the heatsink 9 is absorbed by the grease layer 8. Because the grease layer 8 is not liable to thermal fatigue failure, the life of the semiconductor device is increased.

By using silicon grease as the grease 8, the structure can exhibit excellent heat endurance and heat removal.

In this semiconductor device, by controlling the tightening torque of the bolts 10, it is possible to realize an optimal pressing force of the insulating plate 1 onto the heatsink 9.

Here, in this semiconductor device, because the insulating plate 1 is pressed against the heatsink 9 using the resin case 7, compared to a case wherein the insulating plate 1 is directly tightened with the bolts 10, stress concentrations in the parts of the insulating plate 1 on which the bolts press are moderated and cracking of the insulating plate 1 is thereby prevented.

When the resin case 7 is fixed using an adhesive, thermal expansion of the resin case 7 causes stress to concentrate in the adhered parts and cracking of the adhesive or the resin case 7 tends to occur.

In this semiconductor device, because adhesive is not used and the insulating plate 1 is fixed to the heatsink 9 by being pressed against the heatsink 9, thermal expansion of the resin case 7 is absorbed as slippage of the pressed-together surfaces of the insulating plate 1 and the heatsink 9, and consequently cracking of an adhesive or of the resin case 7 does not occur. If PBT, which has high heat endurance, is used as the material of the resin case 7, an even more reliable semiconductor device can be obtained.

Bushes 11 are embedded in the bolt holes in the resin case 7. As a result, stresses acting on the resin case 7 when the bolts 10 are tightened are moderated and cracking of the resin case 7 is prevented. Also, springs 12 are provided between the heads of the bolts 10 and the resin case 7 to prevent the tightening force from falling due to deformation with time of the resin case 7.

The resin case 7 has a projection 7a positioned on lines substantially parallel with the edges formed by the faces of the insulating plate 1, which presses the insulating plate 1 toward the heatsink 9 from the face of the insulating plate 1 opposite the heatsink 9 side.

Figure 4:
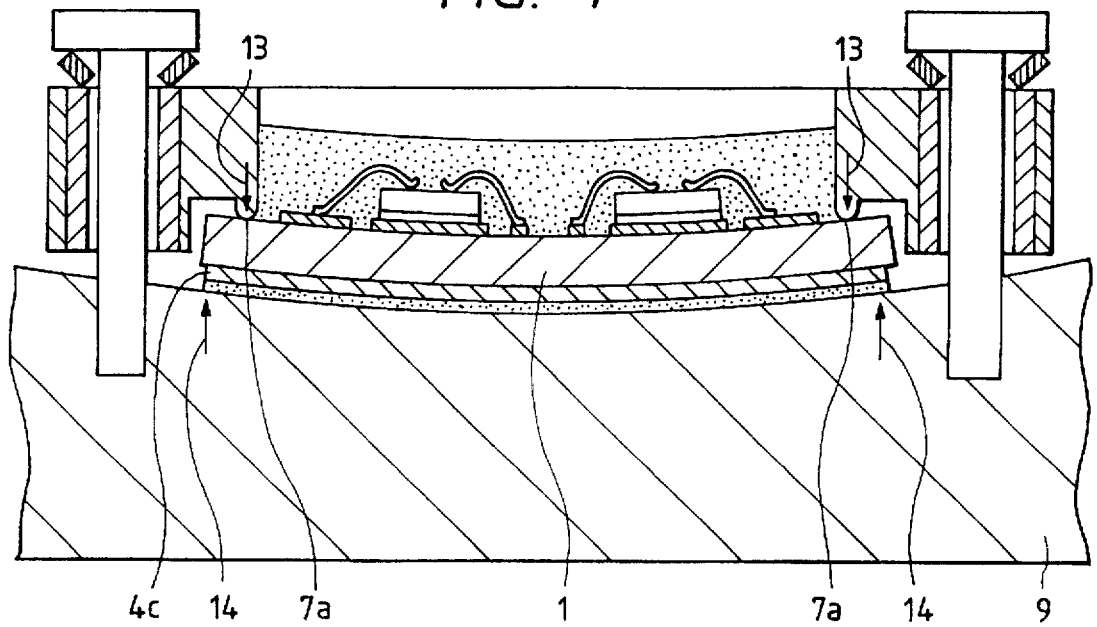
FIG. 4 is a sectional side view illustrating an effect of a semiconductor device according to the invention.

FIG. 4 is a sectional side view of the semiconductor device illustrating an effect of the invention. By using the projection 7a to press the insulating plate 1, as shown in FIG. 4, when there is a downwardly convex curvature in the surface of the heatsink 9, the forces acting on the insulating plate 1 are downward forces 13 exerted by the projection 7a from the resin case 7 side and upward forces 14 exerted by the heatsink 9 at the periphery of the metal film 4c on the rear face of the insulating plate.

Because the downward forces 13 act on the insulating plate 1 inside of the upward forces 14, a downwardly downwardly convex curvature is produced in the insulating plate 1 also, and as a result, the insulating plate 1 can be brought into contact with the heatsink 9. In this way, the transfer of heat from the insulating plate 1 to the heatsink 9 is improved.

Figure 5:
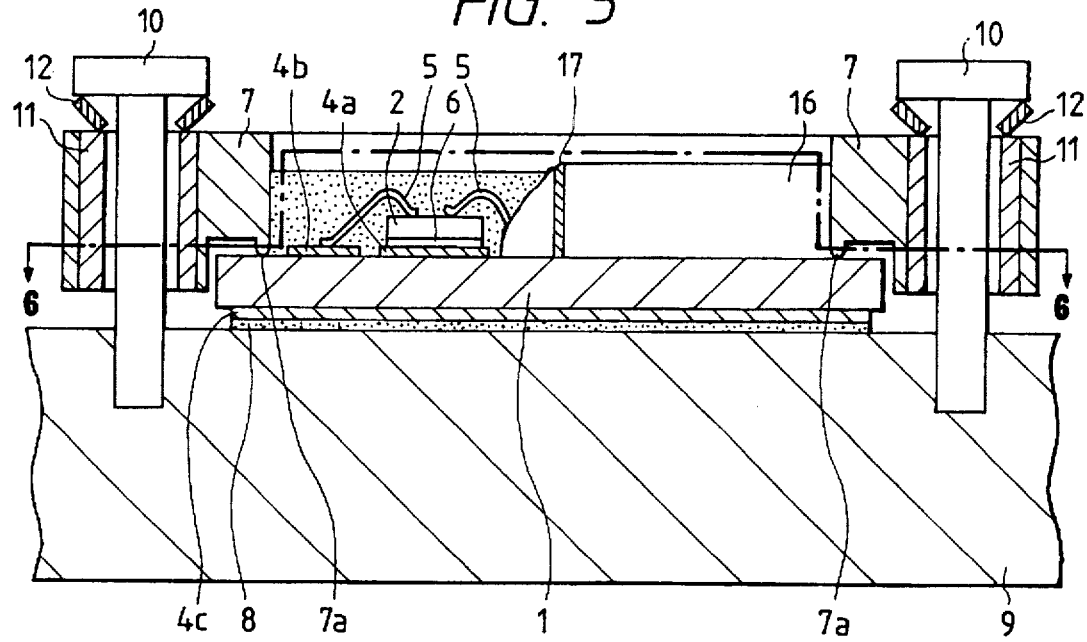
FIG. 5 is a sectional side view of main parts of a semiconductor device of a further preferred embodiment of the invention.
Figure 6:
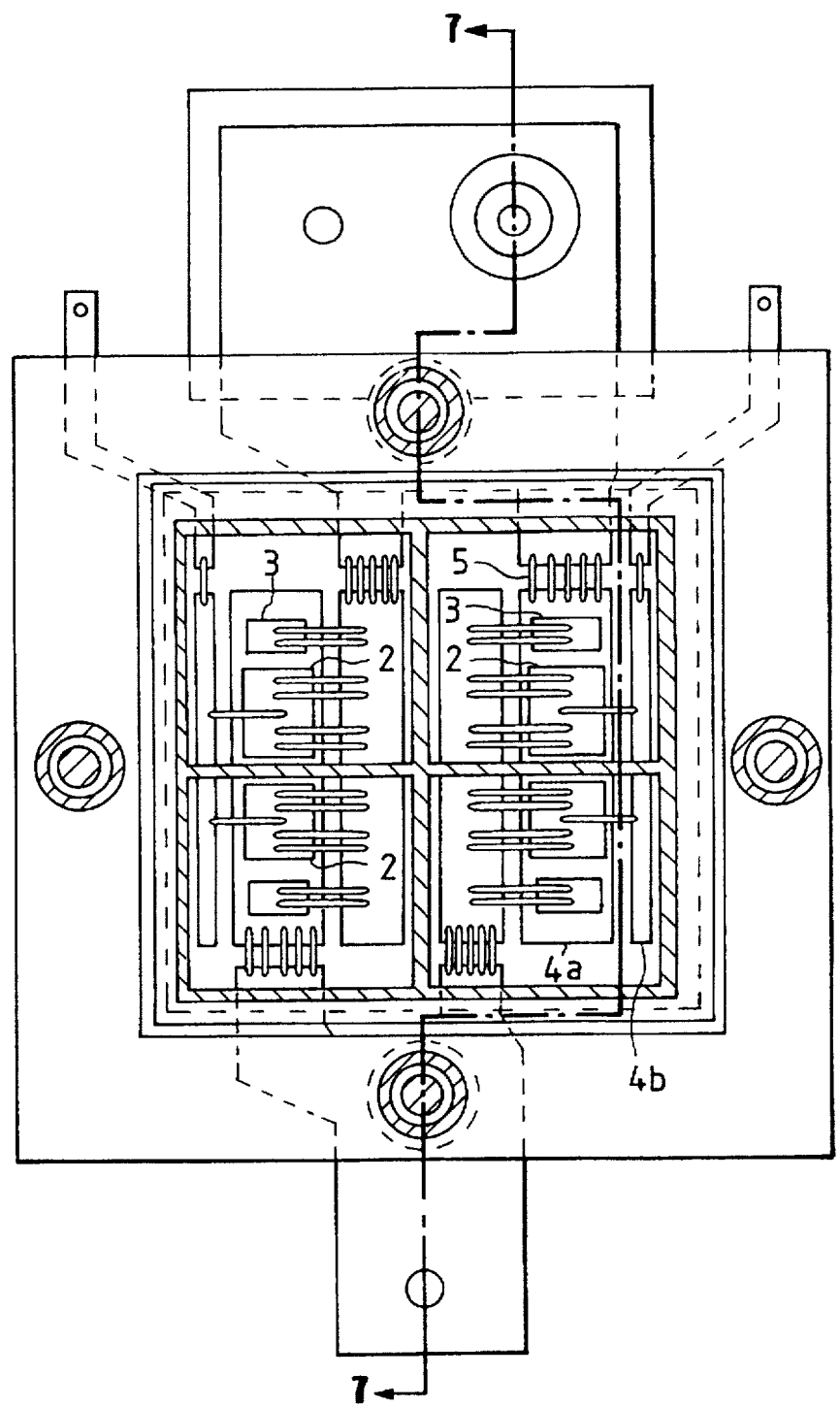
FIG. 6 is a sectional plane view of the semiconductor device on line A—A in FIG. 5.
Figure 7:
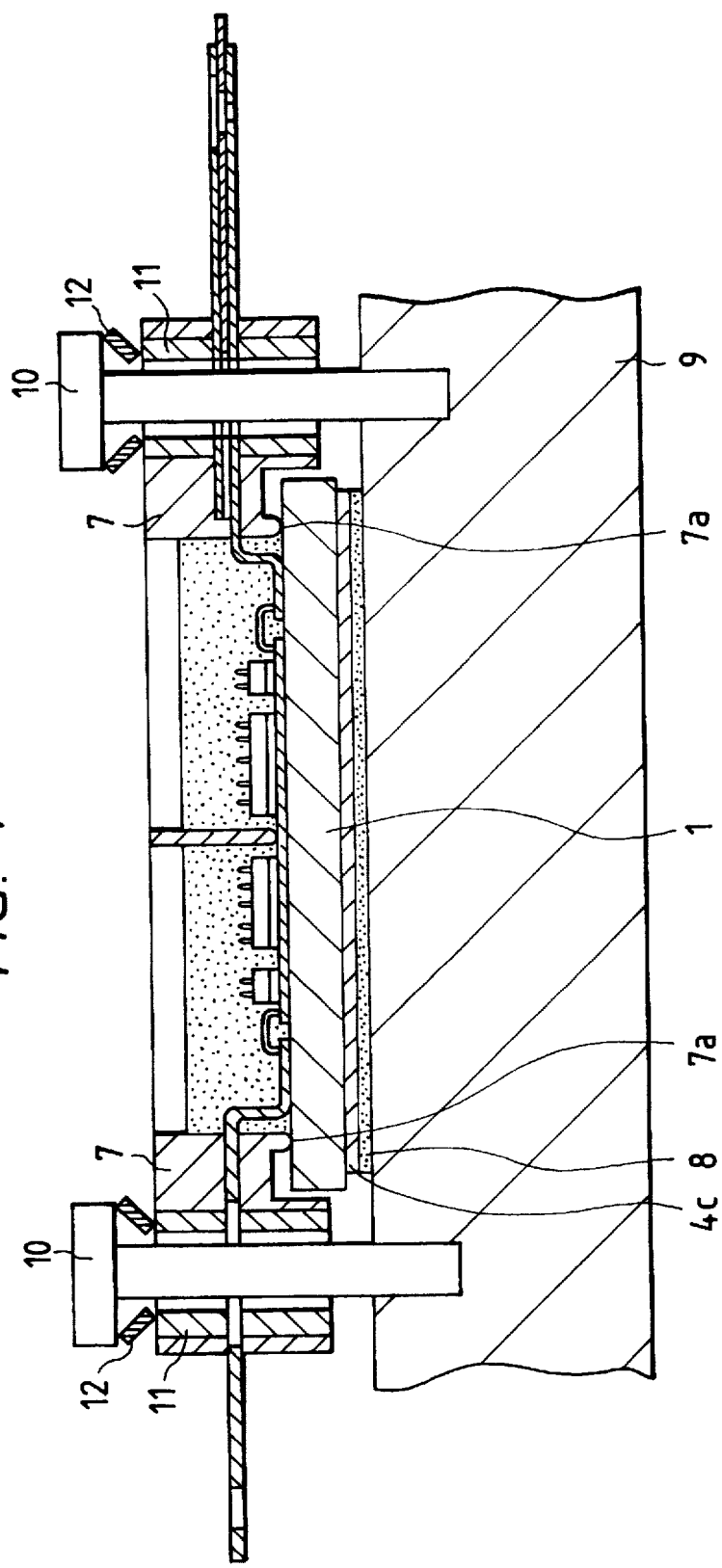
FIG. 7 is a sectional side view of main parts of the semiconductor device taken on line A—A in FIG. 6.

FIG. 5 is a sectional side view of a semiconductor device having the inside ring-form projection 7a on the resin case 7 and a pressing member 17 for pressing the insulating plate 1 formed integrally with the resin case 7; FIG. 6 is a sectional plan view of the semiconductor device shown in FIG. 5; and FIG. 7 is a sectional side view on line A—A in FIG. 6. When this pressing member 17 is provided, compared to a case wherein no pressing member 17 is provided, the semiconductor device is larger in size, but because, when the resin case 7 is fixed by tightening the bolts 10, this pressing member 17 presses the insulating plate 1 against the heatsink 9, the insulating plate 1 can be pressed into even better contact with the heatsink 9. In this way, the transfer of heat from the insulating plate 1 to the heatsink 9 can be further improved.

As shown in FIG. 2, terminal plates 15 are embedded in the resin case 7. By these terminal plates 15 and the metal films 4a and 4b connected by the wires 5, the metal films 4a and 4b are led out as terminals of the IGBT chips 2.

The terminal plates 15 all project from the resin case 7 horizontally, that is, in parallel with the insulating plate 1, and consequently the semiconductor device can be made thinner than in a case wherein there are terminals projecting vertically. If copper is used as the material of the terminal plates 15 their electrical resistance is low and power losses are reduced.

Also, because two terminal plates for a power supply circuit of the semiconductor chip are both flat plates and these two flat plates are mutually superposed with an insulator interposed therebetween and directly connected and fixed to capacitor terminals outside the resin case, an invertor device which can be handled and assembled efficiently and has good manufacturability can be provided.

As shown in FIG. 1, the inside of the resin case 7 is filled with the filler resin 16. In this way, insulation of the surfaces of the semiconductor chips 2 and 3 is improved and the reliability of the circuits is increased.

The projection 7a of the resin case 7, formed so as to press on the insulating plate 1, is provided in the form of a ring enclosing the semiconductor chips 2 and 3, as shown in FIG. 2.

In this way, filler resin 16 is prevented from leaking from the resin case 7 to the outside. As a result, because it is possible to cover the semiconductor chips 2 and 3 certainly using a small amount of the filler resin 16, while still ensuring insulation of the vicinity of the surface of the semiconductor chips 2 and 3, the quantity of the filler resin 16 used can be reduced and the semiconductor device can thereby be made light.

By using silicone gel as the material of the filler resin 16, a structure having excellent insulation can be obtained. Also, because this material deforms easily, forces are not exerted on the wires 5 and breakage of the wires 5 can therefore be prevented.

Also, because by this projection 7a is formed in the form of a ring in this way, the contact quality between the part of the insulating plate 1 on which the semiconductor chips 2 and 3 are mounted and the heatsink 9 is increased, and the projection 7a being provided in the form of a ring is also effective in improving the transfer of heat produced by the semiconductor chips 2 and 3 to the heatsink 9.

Also, when a pressing member 17 is provided inside the ring-form projection 7a of the resin case 7 for pressing the insulating plate 1 and this pressing member 17 is formed integrally with the resin case 7, as compared to a device in which no pressing member 17 is provided, the semiconductor device will be larger in size, but because, when the resin case 7 is fixed by tightening the bolts 10 this pressing member 17 presses the insulating plate 1 against the heatsink 9, the insulating plate 1 can be pressed into even better contact with the heatsink 9. In this way, the transfer of heat from the insulating plate 1 to the heatsink 9 can be further improved.

As shown in FIG. 3, a main part of a 3-phase invertor device can be made by disposing three semiconductor devices constructed as shown in FIG. 2 in a line.

In FIG. 3, the detailed structures inside the resin cases 7 are not shown. Also, circuits for outputs of the three phases are not shown. Here, an insulating plate 1 and a resin case 7 are provided for each of the circuits for the outputs of the three phases and each is fixed to the heatsink 9 with bolts 10.

In this way, compared to a semiconductor device wherein all three phases are integrated, the quality of the contact between the insulating plates 1 and the heatsink 9 can be improved and the removal of heat from the device can be improved. Also, because the amount of the filler resin 16 used can be reduced, there is the effect that the device can be made lighter.

When more insulating plates 1 and resin cases 7 than one per phase are used, because the number of terminal plates 15 increases, the semiconductor device becomes large. However, in this semiconductor device, because one insulating plate 1 and one resin case 7 are provided per phase, the number of the terminal plates 15 is kept down and the semiconductor device can be made small.

Here, terminal plates 15a for power supply and terminal plates 15b to be connected to a gate driving circuit all project from one side of the resin cases 7, and output side terminal plates 15c and the input side terminal plates 15a and 15b project from opposite sides of the resin cases 7.

By adopting this kind of construction, wiring to the outside is organized and the semiconductor device can be made even smaller.

Also, because the two terminal plates for the power supply circuit of the semiconductor chip are both flat plates and these two flat plates are mutually superposed with an insulator interposed therebetween and are directly connected and fixed to capacitor terminals outside the resin case, an invertor device which can be handled and assembled efficiently and has good manufacturability can be provided.

As described above, according to this semiconductor device, because a structure is employed wherein the resin case 7 is used to press the insulating plate 1 against the heatsink 9, a solder layer between the insulating plate 1 and the heatsink 9 becomes unnecessary. Also, because differential thermal expansion between the insulating plate 1 and the heatsink 9 is absorbed as slippage between the two plates, thermal fatigue failure of the joined parts of the insulating plate and the heatsink does not occur.

Furthermore, in this semiconductor device, because the insulating plate 1 and the heatsink 9 are pressed into contact with each other, heat flows easily between the two plates and good removal of heat from the semiconductor device can be ensured.

Also, with this semiconductor device, because a metal base can be dispensed with, the semiconductor device can be made small.

Also, with this semiconductor device, because forces pressing the insulating plate 1 are applied by way of the resin case 7, stresses in the insulating plate 1 are moderated and consequently cracking of the insulating plate 1 can be prevented.

Also, in this semiconductor device, since the resin case 7 has a projection 7a which, from the front face of the insulating plate 1, presses against the insulating plate 1 at positions inward of the periphery of the metal film on the rear face of the insulating plate 1 toward the heatsink 9 on the rear face side of the insulating plate 1, even if the heatsink 9 is curved, the insulating plate 1 can be pressed into contact with the heatsink 9 and good heat removal from the device can be obtained.

Also, in this semiconductor device, since the projection 7a is provided in the form of a ring surrounding the semiconductor chips 2 and 3, leakage of the filler resin 16 from inside the resin case 7 to the outside can be prevented.

In this way, because it is possible to cover the semiconductor chips certainly using a small amount of filler resin, while still ensuring insulation of the vicinity of the surface of the semiconductor chips, the quantity of filler resin used can be reduced and the semiconductor device can thereby be made light.

Also, in this semiconductor device, since this projection 7a is provided in the form of a ring surrounding the semiconductor chips 2 and 3, the contact quality between the part of the insulating plate 1 on which the semiconductor chips 2 and 3 are mounted and the heatsink 9 is increased and the transfer of heat from the insulating plate 1 can be improved.

Also, in this semiconductor device, since the insulating plate is pressed against the heatsink 9 using the bolts 10, an optimal pressing force can be realized and good heat removal characteristics and prevention of cracking of the insulating plate 1 can be achieved at the same time.

Also, in this semiconductor device, because the insulating plate 1 is pressed against the heatsink 9 by way of a grease layer 8, minute gaps between the insulating plate 1 and the heatsink 9 are filled in by the grease layer 8, and it is possible to further improve the transfer of heat from the insulating plate 1 to the heatsink 9.

Furthermore, in this semiconductor device, as a result of the fact that the resin case 7 and the insulating plate 1 are joined by contact pressure, differential thermal expansion between the two is absorbed as slippage, and failure of mounting parts of the resin case can be prevented.

Also, in this semiconductor device, by providing an insulating plate 1 and a resin case 7 for each circuit supplying an output of a phase of an invertor device and fixing each resin case 7 to the heatsink 9 with bolts 10 so that each insulating plate 1 is pressed against the heatsink 9, the quality of the contact between the insulating plates 1 and the heatsink 9 can be made good and the removal of heat from the device can be improved.

As a result of providing separate insulating plates 1 and resin cases 7 in this way, the amount of filler resin used to can be reduced, and the device can be made small and light.

Also, in this semiconductor device, by providing the terminals projecting from the resin case in parallel with the surface of the heatsink and a terminal for a gate driving circuit and a terminal for a power supply circuit projecting from one side of the resin case and a terminal plate for an output projecting from the opposite side of the resin case, wiring to the outside the resin case is organized and the semiconductor device can be made thin and small.

What is claimed is:

1. A semiconductor device, comprising an insulating plate on which are mounted semiconductor chips, a resin case enclosing the semiconductor chips, a filler resin filled into the resin case and covering the semiconductor chips and filling in a space between the semiconductor chips and the resin case, a heatsink to which the insulating plate is attached, and means for attaching the insulating plate to the heatsink by using the resin case to press the insulating plate against the heatsink.

2. A semiconductor device according to claim 1, wherein a metal film is formed on the face of the insulating plate on the heatsink side thereof, wherein the resin case has a projection adjacent the face of the insulating plate opposite the heatsink side thereof, wherein, when viewing the semiconductor device from a plane view perspective, the plane view position of said projection is inside of the plane view outline of said metal film such that said plane view position of the projection is surrounded by the plane view outline of the metal film, and wherein said projection presses the insulating plate toward the heatsink from the face of the insulating plate opposite the heatsink side thereof.

3. A semiconductor device according to claim 1, wherein said means for attaching the insulating plate to the heatsink includes bolt holes in said resin case for bolts to pass through and screw holes for the bolts in the heatsink so that the insulating plate is pressed against the heatsink by head portions of bolts which pass through the bolt holes in the resin case and are screwed into the screw holes formed in the heatsink.

4. A semiconductor device according to claim 1, wherein a grease layer is provided between the insulating plate and the heatsink.

5. A semiconductor device according to claim 2, wherein said projection is provided in the form of a ring positioned on lines substantially parallel with the edges formed by the faces of the insulating plate, and the semiconductor chips are disposed inside the ring-form boundary of said projection.

6. A semiconductor device according to claim 5, wherein inside the ring-form boundary of said projection on the resin case there is provided a pressing member for pressing the insulating plate and this pressing member is formed integrally with the resin case.

7. A semiconductor device, comprising: an insulating plate on which are mounted semiconductor chips, a resin case enclosing the semiconductor chips, a filler resin filled into the resin case and covering the semiconductor chips and filling in a space between the semiconductor chips and the resin case, and a heatsink to which the insulating plate is attached, wherein the insulating plate and the heatsink are thermally joined by means for applying a contact pressure to the insulating plate to bias it against said heatsink.

8. A multiple-phase invertor device having a plurality of circuits, each circuit providing an output of a respective phase of the invertor device, comprising: an insulating plate on which are mounted semiconductor chips, a resin case enclosing the semiconductor chips, a filler resin filled into the resin case and covering the semiconductor chips and filling in a space between the semiconductor chips and the resin case, and a heatsink to which the insulating plate is attached, wherein each one of said plurality of circuits respectively corresponds to one phase of the multiple phase invertor device, wherein each circuit includes an insulating plate and a corresponding resin case and wherein each of the insulating plates are pressed against the heatsink by the corresponding resin cases which are fixed to the heatsink with bolts.

9. A semiconductor device, comprising: an insulating plate on which are mounted semiconductor chips, a resin case enclosing the semiconductor chips, a filler resin filled into the resin case and covering the semiconductor chips and filling in a space between the semiconductor chips and the resin case, and a heatsink to which the insulating plate is attached, wherein the resin case has terminal plates which project from the resin case in directions substantially parallel to the surface of the heatsink, including terminal plates for a gate driving circuit and terminal plates for a power supply circuit which project from one side of the resin case and terminal plates for an output which project from the side of the resin case opposite said one side thereof.

10. A semiconductor comprising: an insulating plate on which are mounted semiconductor chips, a resin case enclosing the semiconductor chips, a filler resin filled into the resin case and covering the semiconductor chips and filling in a space between the semiconductor chips and the resin case, and a heatsink to which the insulating plate is attached, wherein two terminal plates for a power supply circuit of the semiconductor chips are provided in the form of flat plates which are mutually superposed with an insulator interposed therebetween and are directly connected and fixed to capacitor terminals outside the resin case.

11. A semiconductor device according to claim 9, wherein the semiconductor device is an invertor.

12. A semiconductor device according to claim 10, wherein the semiconductor device is an invertor.

13. A semiconductor device, comprising:

an insulating plate on which are mounted semiconductor chips, a resin case enclosing the semiconductor chips, a filler resin filled into the resin case and covering the semiconductor chips and filling in a space between the semiconductor chips and the resin case, a heatsink to which the insulating plate is attached, and means for attaching the insulating plate to the heatsink without using solder between the insulating plate and the heatsink by forcibly pressing the insulating plate against the heatsink using the resin case to exert pressing force.

14. A semiconductor device according to claim 13, wherein a grease layer is provided between the insulating plate and the heatsink to absorb differential thermal expansion between the insulating plate and the heatsink.

15. A semiconductor device according to claim 13, wherein the semiconductor device is an invertor.

* * * * *